US008404539B2

(12) United States Patent
Chang et al.

(10) Patent No.: US 8,404,539 B2
(45) Date of Patent: Mar. 26, 2013

(54) SELF-ALIGNED CONTACTS IN CARBON DEVICES

(75) Inventors: Josephine B. Chang, Mahopac, NY (US); Dechao Guo, Wappingers Falls, NY (US); Shu-Jen Han, Cortlandt Manor, NY (US); Chung-Hsun Lin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 12/832,224

(22) Filed: Jul. 8, 2010

(65) Prior Publication Data
US 2012/0007054 A1 Jan. 12, 2012

(51) Int. Cl.
*H01L 21/8238* (2006.01)
(52) U.S. Cl. .......................................... 438/229; 257/29
(58) Field of Classification Search .................. 257/29; 438/229, 154, 138
See application file for complete search history.

(56) References Cited

U.S. PATENT DOCUMENTS

| 6,891,227 | B2 | 5/2005 | Appenzeller et al. | |
|---|---|---|---|---|
| 7,170,120 | B2 | 1/2007 | Datta et al. | |
| 7,492,015 | B2 | 2/2009 | Chen et al. | |
| 7,687,841 | B2* | 3/2010 | Sandhu | 257/296 |
| 2006/0175950 | A1* | 8/2006 | Itou et al. | 313/311 |
| 2007/0029612 | A1 | 2/2007 | Sandhu | |
| 2007/0132043 | A1* | 6/2007 | Bradley et al. | 257/414 |
| 2008/0026534 | A1* | 1/2008 | Avouris et al. | 438/301 |
| 2008/0293228 | A1 | 11/2008 | Kalburge | |
| 2009/0032804 | A1 | 2/2009 | Kalburge | |
| 2009/0236675 | A1 | 9/2009 | Yang et al. | |
| 2010/0051897 | A1 | 3/2010 | Chen et al. | |
| 2010/0320437 | A1* | 12/2010 | Gordon et al. | 257/9 |

OTHER PUBLICATIONS

A. Javey et al., "Self-Aligned Ballistic Molecular Transistors and Electrically Paralleg Nanotube Arrays", Nano Lett. 4, 2004, pp. 1319-1322, published on Web Jun. 23, 2004.
A. Raychowdhury et al., "Carb on Nanotube Field-Effect Transistors for High-Perfomrance Digital Circuits—DC Analysis and modeling Toward Optimum Transistor Structure," IEEE Trans on Elec Dev, vol. 53, No. 11, 2006, pp. 2711-2717, downloaded on Apr. 27, 2010 from IEEE Xplore.
H. Dai, "Carbon Nanotubes: Synthesis, Integration, and Properties," Published on Web Aug. 7, 2002, copyright 2002 American Chemical Society; Acc. Chem. Res. 2002, 35, 1035-1044.
J. Chen et al., "Self-aligned carbon nanotube transistors with charge transfer doping," Appl. Phys Lett., vol. 86, 123108, published online Mar. 2005.
K. Nagashio et al., "Metal/Graphene Contact as a Performance Killer of Ultra-high Mobility Graphene—Analysis of Intrinsic Mobility and Contact Resistance-," 2009 IEDM, pp. 565-568, downloaded Apr. 27, 2010 from IEEE Xplore.
K. V. Emstev et al., "Towards Wafer-Size Graphene Layers by Atmospheric Pressure Graphitization of Silicon Carbide," Published online Feb. 8, 2009, DOI:10.1038/NMAT2382; Nature Materials, vol. 8, Mar. 2009, pp. 203-207.
M. C. Lemieux et al., "Self-Sorted, Aligned Nanotube Networks for Thin-Film Transistors," Science 321, 101-104 (Jul. 4, 2008); DOI: 10.1126/science.1156588.

(Continued)

*Primary Examiner* — Thao P. Le
(74) *Attorney, Agent, or Firm* — Cantor Colburn LLP; Vazken Alexanian

(57) ABSTRACT

A method for forming a semiconductor device includes forming a carbon material on a substrate, forming a gate stack on the carbon material, removing a portion of the substrate to form at least one cavity defined by a portion of the carbon material and the substrate, and forming a conductive contact in the at least one cavity.

13 Claims, 2 Drawing Sheets

OTHER PUBLICATIONS

X. Li et al., "Large-Area Synthesis of High-Quality and Uniform Graphene Films on Copper Foils," Science 324, 1312-1314 (Jun. 5, 2009); DOI: 10.1126/science.1171245.

K. A. Jenkins et al., pending patent U.S. Appl. No. 12/617,770 entitled "Self-Aligned Graphene Transistor," filed with the U.S. Patent and Trademark Office on Nov. 13, 2009.

International Search Report; International Application No. PCT/EP2011/061016; International Filing Date: Jun. 30, 2011; Date of Mailing: Sep. 14, 2011.

International Search Report—Written Opinion; International Application No. PCT/EP2011/061016; International Filing Date: Jun. 30, 2011; Date of Mailing: Sep. 14, 2011.

\* cited by examiner

_US 8,404,539 B2_

SELF-ALIGNED CONTACTS IN CARBON DEVICES

FIELD OF INVENTION

The present invention relates to semiconductor graphene and carbon nanotube field effect transistor devices and to methods that allow the fabrication of contacts in graphene and carbon nanotube devices.

DESCRIPTION OF RELATED ART

Semiconductor devices formed from silicon often include ion doped source and drain regions. It is desirable to form the source and drain regions proximate to the gate of the device to avoid a non-conductive region that may result in an undesirably high parasitic resistance in the device. It is also desirable to avoid forming source and drain regions under the gate that may result in an undesirably high parasitic capacitance in the device.

Carbon devices may include a layer of carbon material such as, for example graphene or carbon nanotubes. Though carbon materials are not usually doped with ions, the location of the source and drain regions in carbon devices affect the parasitic resistance and capacitance of such devices.

BRIEF SUMMARY

In one aspect of the present invention, a method for forming a semiconductor device includes forming a carbon material on a substrate, forming a gate stack on the carbon material, forming a spacer over on the gate stack and portions of the carbon material, removing exposed portions of the carbon material, removing exposed portions of the substrate to form cavities defined by the carbon material and the substrate, and forming conductive contacts in the cavities.

In another aspect of the present invention, a semiconductor device includes a carbon layer disposed on a substrate, a gate stack disposed on a portion of the carbon layer, a first cavity defined by the carbon layer and the substrate, a second cavity defined by the carbon layer and the substrate, a source region including a first conductive contact disposed in the first cavity, a drain region including a second conductive contact disposed in the second cavity.

In yet another aspect of the present invention, a method for forming a semiconductor device includes forming a carbon material on a substrate, forming a gate stack on the carbon material, removing a portion of the substrate to form at least one cavity defined by a portion of the carbon material and the substrate, and forming a conductive contact in the at least one cavity.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

FIGS. 1-7 illustrate a side view of a method for forming a semiconductor device with graphene having source and drain regions that avoid undesirable parasitic resistance and capacitance in the device.

Figure 1:
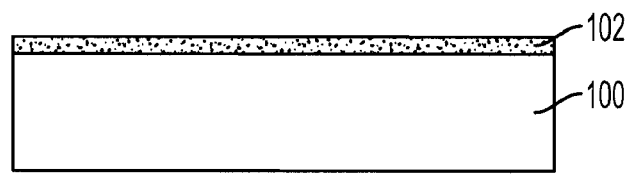
FIGS. 1-7 illustrate a side view of a method for forming a semiconductor device and the resultant semiconductor device.

Referring to FIG. 1, a carbon material 102 such as, for example, two-dimensional graphene material, graphene nanotube(s) material, or carbon nanotube(s) material is formed on a substrate 100. The substrate 100 may include, for example, a silicon dioxide material or a silicon carbide material.

The carbon material 102 may include a layer of graphene that may be formed by, for example, epitaxially forming a layer of graphene on a metallic foil such as, for example, copper (not shown) using a chemical vapor deposition process using methane and transferring the carbon material 102 to the substrate 100. The carbon material 102 may also be formed by epitaxially forming graphene on a silicon carbide substrate using an annealing process that removes Si from the silicon carbide substrate resulting in a graphene monolayer. Alternatively, the carbon material 102 may include nanotubes that may be formed by, for example, a spincoating method or a chemical vapor deposition process.

The following references include examples of methods that may be used for forming the carbon material 102: X. Li et al. "Large-Area Synthesis of High-Quality and Uniform Graphene Films on Copper Foils", Science (2009), 324, 1312-1314; K. V. Emtsev et al., "Towards wafer-size graphene layers by atmospheric pressure graphitization of silicon carbide", Nature Materials, (2009), 8, 203-207; Dai, H., "Carbon Nanotubes: Synthesis, Integration, and Properties", _Acc. Chem. Res._, 35, 1035-1044, 2002; LeMieux, M., et al., "Self-Sorted, Aligned Nanotube Networks for Thin-Film Transistors", _Science_, vol. 321, pp. 101-104, 2008.

Figure 2:
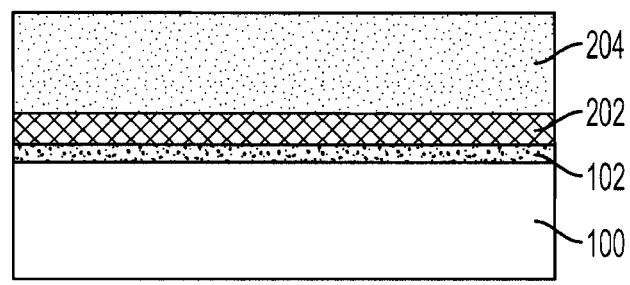

Referring to FIG. 2, a dielectric layer 202 such as, for example a high-k dielectric material (e.g., hafnium silicate, zirconium silicate, hafnium dioxide, or zirconium dioxide) is formed on the carbon material 102 by, for example, an atomic layer deposition process. A metallic layer 204 is formed on the dielectric layer 202. The metallic layer 204 may be formed from, for example, tantalum, tungsten, tantalum nitride, palladium, aluminum, or titanium nitride.

Figure 3:
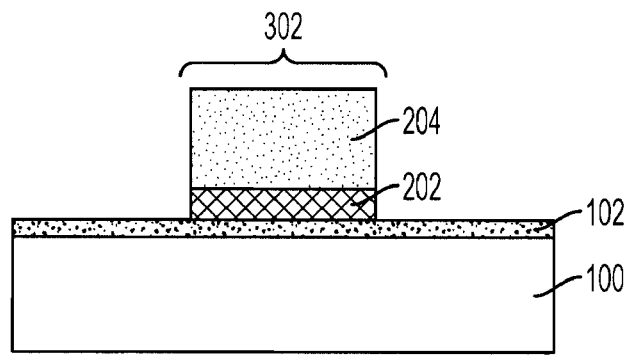

FIG. 3 illustrates the resultant structure following the removal of portions of the metallic layer 204 and dielectric layer 202 that exposes portions of the carbon material 102 and forms a gate stack 302. The gate stack 302 includes a portion of the dielectric layer 202 and the metallic layer 204. The portions of the metallic layer 204 and the dielectric layer 202 may be removed by a suitable etching process such as for example, a reactive ion etching (RIE) and wet etch process. For example, a RIE process may be used to remove portions of the metallic layer 204, and a wet etching process may be used to remove portions of the dielectric layer 202.

Figure 4:
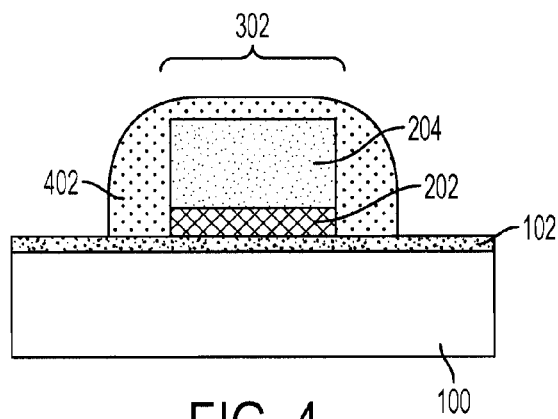

FIG. 4 illustrates the resultant structure following the formation of an encapsulating spacer 402 over the gate stack 302 and portions of the graphene layer 102. The spacer 402 may be formed from, for example a nitride material or an oxide material such as hafnium oxide.

Figure 5:
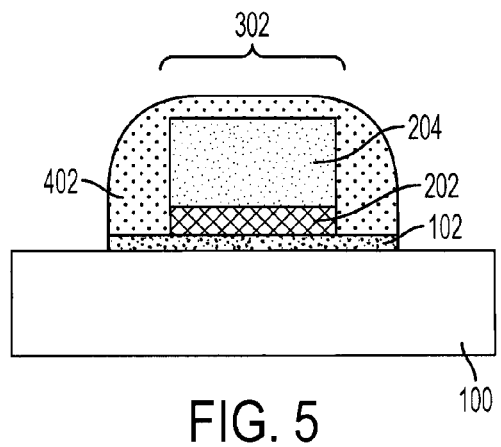

Referring to FIG. 5, exposed portions of the carbon material 102 are removed by, for example, an oxygen plasma etching process that selectively removes the exposed carbon material 102 and exposes portions of the substrate 100, but does not appreciably remove the spacer 402 material or the substrate 100 material.

Figure 6:
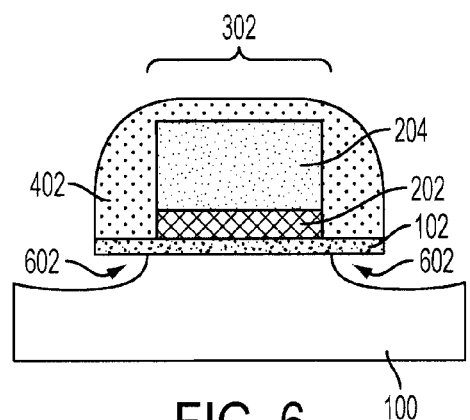

FIG. 6 illustrates the resultant structure following an isotropic etching of the substrate 100 that removes exposed portions of the substrate 100. The etching process may include for example, an isotropic wet etching process. The etching forms cavities 602 defined by the carbon material 102 and the substrate 100. The etching process is controlled to form the cavities 602 under the spacer 402.

Figure 7:
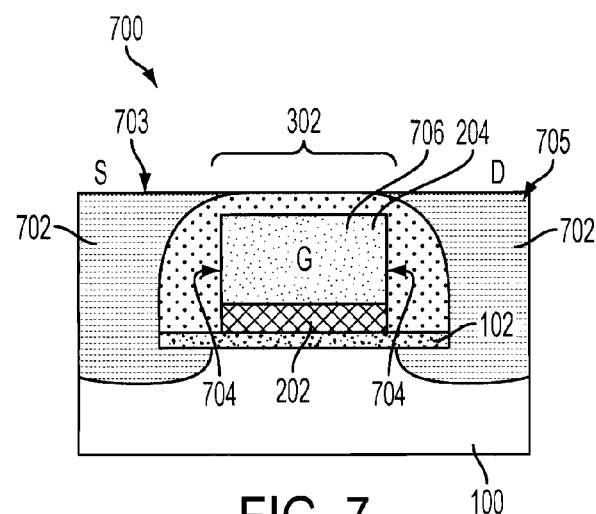

FIG. 7 illustrates a device 700 that is formed following the formation of conductive contacts 702. The conductive contacts form a source region (S) 703 and a drain region (D) 705 in the cavities 602 (of FIG. 6). The conductive contacts 702 may be formed by, for example, an atomic layer deposition process followed by a chemical vapor deposition process of a conductive metal such as, copper, aluminum, palladium, or silver.

The device 700 includes the carbon material 102 disposed on the substrate 100, the gate stack 302 including the dielectric layer 202 disposed on the carbon material 102, the metallic gate material 204 that forms a gate (G) 706 disposed on the dielectric layer 202, and the conductive contacts 702 that form the source and drain regions 703 and 705.

The isotropic etching of the substrate 100 discussed above in FIG. 6, may be controlled to effect the geometry of the cavities 602. Though the illustrated embodiment includes cavities 602 that are aligned with the longitudinal edges 704 of the gate stack 302, it may be desirable to "overlap" the device 700 by controlling the isotropic etching process to extend the cavities 602 under the gate stack 302, or "underlap" the device 700 by forming smaller cavities 602 that do not extend to the longitudinal edges 702 of the gate stack 302

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flows depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a semiconductor device, the method including:
    forming a layer of carbon material on a substrate;
    forming a dielectric layer on and in contact with the layer of carbon material;
    forming a metallic layer on and in contact with the dielectric layer;
    removing portions of the metallic layer and portions of the dielectric layer to expose portions of the layer of carbon material and form a gate stack disposed on the layer of carbon material;
    forming a spacer over the gate stack and portions of the layer of carbon material, wherein the spacer is in contact with the carbon material;
    removing exposed portions of the layer of carbon material with an etching process that selectively removes the exposed portions of the layer of carbon material without removing portions of the substrate;
    removing exposed portions of the substrate to form cavities defined by the layer of carbon material and the substrate; and
    forming conductive contacts in the cavities.

2. The method of claim 1, wherein the etching process that selectively removes the exposed portions of the layer of carbon material without removing portions of the substrate includes an oxygen plasma etching process, and the removing exposed portions of the substrate to form the cavities defined by the layer of carbon material and the substrate includes an isotropic etching process.

3. The method of claim 1, wherein the removing the exposed portions of the substrate to form the cavities includes an isotropic etching process.

4. The method of claim 1, wherein the removing the exposed portions of the substrate to form the cavities includes a wet etching process.

5. The method of claim 1, wherein the removing the exposed portions of the layer of carbon material includes an oxygen plasma etching process.

6. The method of claim 1, wherein the layer of carbon material includes a graphene layer.

7. The method of claim 1, wherein the substrate includes a silicon dioxide material.

8. The method of claim 1, wherein the substrate includes a silicon carbide material.

9. A method for forming a semiconductor device, the method including:
    forming a layer of carbon material on a substrate;
    forming a gate stack on the layer of carbon material;
    forming a spacer over the gate stack and portions of the layer of carbon material, wherein the spacer is in contact with the carbon material;
    removing exposed portions of the layer of carbon material with an etching process that selectively removes the exposed portions of the layer of carbon material without removing portions of the substrate;
    removing a portion of the substrate to form at least one cavity defined by a portion of the layer of carbon material and the substrate; and
    forming a conductive contact in the at least one cavity.

10. The method of claim 9, wherein the removing the portion of the substrate to form the at least one cavity includes an isotropic etching process.

11. The method of claim 9, wherein the removing the portion of the substrate to form the at least one cavity includes a wet etching process.

12. The method of claim 9, wherein the etching process that selectively removes the exposed portions of the layer of carbon material without removing portions of the substrate includes an oxygen plasma etching process.

13. A method for forming a semiconductor device, the method including:

forming a layer of carbon material on a substrate;

forming a gate stack on the carbon material, the gate stack including a high-k dielectric layer on, and in contact with, the layer of carbon material;

forming a spacer over the gate stack and portions of the layer of carbon material, wherein the spacer is in contact with portions of the layer of carbon material;

removing exposed portions of the layer of carbon material with an etching process that selectively removes the exposed portions of the layer of carbon material without removing portions of the substrate;

removing exposed portions of the substrate to form cavities defined by the layer of carbon material and the substrate; and forming conductive contacts in the cavities.

\* \* \* \* \*